United States Patent
Godet et al.

(10) Patent No.: US 9,425,027 B2
(45) Date of Patent: Aug. 23, 2016

(54) METHODS OF AFFECTING MATERIAL PROPERTIES AND APPLICATIONS THEREFOR

(75) Inventors: Ludovic Godet, Boston, MA (US); Christopher Hatem, Hampton, NH (US); Deepak Ramappa, Cambridge, MA (US); Xianfeng Lu, Beverly, MA (US); Anthony Renau, West Newbury, MA (US); Patrick Martin, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 761 days.

(21) Appl. No.: 13/470,731

(22) Filed: May 14, 2012

(65) Prior Publication Data
US 2012/0288637 A1 Nov. 15, 2012

Related U.S. Application Data

(60) Provisional application No. 61/486,296, filed on May 15, 2011, provisional application No. 61/486,297, filed on May 15, 2011, provisional application No. 61/486,299, filed on May 15, 2011.

(51) Int. Cl.
*C23C 14/48* (2006.01)
*C23C 14/34* (2006.01)
(Continued)

(52) U.S. Cl.
CPC ......... *H01J 37/32412* (2013.01); *B41J 2/1606* (2013.01); *C23C 14/48* (2013.01); *H01J 37/32422* (2013.01); *H01J 37/32623* (2013.01)

(58) Field of Classification Search
CPC .. B41J 2/1696; C23C 14/48; H01J 37/32412; H01J 37/32623
See application file for complete search history.

(56) References Cited

U.S. PATENT DOCUMENTS

| 4,743,493 A | 5/1988 | Sioshansi et al. |
| 5,149,976 A | 9/1992 | Sipma |

(Continued)

FOREIGN PATENT DOCUMENTS

| DE | 102004062992 A1 | 7/2006 |
| EP | 0121623 A2 | 10/1984 |
| WO | 2012044536 A1 | 4/2012 |

OTHER PUBLICATIONS

Nakano, S., et al., Functional Fabrication of MEMS by Ion Implantation, AIP Conference Proceedings, 2001, pp. 939-942, vol. 576, American Institute of Physics, United States.

(Continued)

*Primary Examiner* — Dah-Wei D Yuan
*Assistant Examiner* — Kristen A Dagenais
(74) *Attorney, Agent, or Firm* — Nields, Lemack & Frame, LLC

(57) ABSTRACT

Methods of affecting a material's properties through the implantation of ions, such as by using a plasma processing apparatus with a plasma sheath modifier. In this way, properties such as resistance to chemicals, adhesiveness, hydrophobicity, and hydrophilicity, may be affected. These methods can be applied to a variety of technologies. In some cases, ion implantation is used in the manufacture of printer heads to reduce clogging by increasing the materials hydrophobicity. In other embodiments, MEMS and NEMS devices are produced using ion implantation to change the properties of fluid channels and other structures. In addition, ion implantation can be used to affect a material's resistance to chemicals, such as acids.

7 Claims, 12 Drawing Sheets

(51) Int. Cl.
  *H01J 37/32* (2006.01)
  *B41J 2/16* (2006.01)

(56) References Cited

U.S. PATENT DOCUMENTS

| | | | |
|---|---|---|---|
| 6,247,908 B1* | 6/2001 | Shinohara | F04B 43/046 |
| | | | 417/413.2 |
| 7,687,256 B2 | 3/2010 | Little | |
| 2005/0070073 A1* | 3/2005 | Al-Bayati | C23C 14/48 |
| | | | 438/460 |
| 2008/0197356 A1* | 8/2008 | Kim | H01L 27/12 |
| | | | 257/71 |
| 2010/0004144 A1* | 1/2010 | Little | B01J 19/0046 |
| | | | 506/17 |
| 2010/0238236 A1 | 9/2010 | Uchiyama | |
| 2010/0252531 A1 | 10/2010 | Godet et al. | |

OTHER PUBLICATIONS

Op De Beeck, M., et al., Design and Fabrication Of A Biomedical Lab-on-chip System For SNP Detection In DNA, Electron Devices Meeting, 2010, pp. 36.3.1 to 36.3.4, IEEE.

Zimmerman, R.L., et al., Enhancement Of Porosity And Surface Roughness Of Cured Phenolic Resin by Ion Implantation, Materials Research Society Symposium, 2001, pp. 4.8.1 to 4.8.6, vol. 647, Materials Research Society.

Kumar, A., et al., Electron Microscopy For Understanding Swift Heavy Ion Irradiation Effects On Electroactive Polymers, Microscopy: Science, Technology, Applications and Education, 2010, pp. 1755 to 1768, FORMATEX.

Guzman, L., et al., Hard Coating Adhesion on Ion Implanted Polymer Surfaces, Thin Solid Films, 2000, pp. 760-765, vols. 377-378, Elsevier, Amsterdam, The Netherlands.

\* cited by examiner

PHOTORESIST PATTERNED

PHOTORESIST HARDENED WITH
HELIUM IMPLANT

REFERENCE SAMPLE

NO IMPLANT;
5 SEC ACETONE RINSE

He IMPLANT;
5 SEC ACETONE RINSE

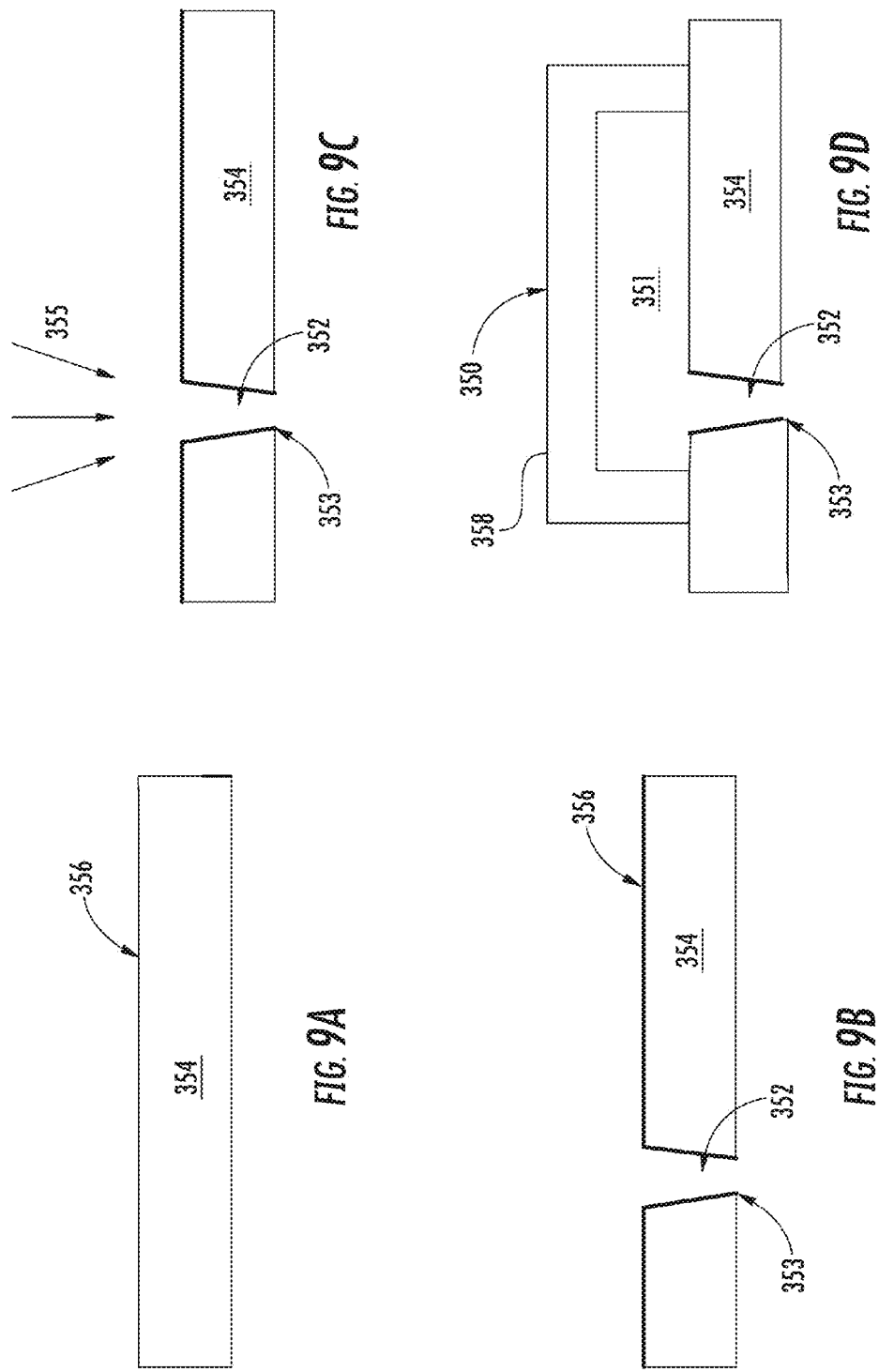

METHODS OF AFFECTING MATERIAL PROPERTIES AND APPLICATIONS THEREFOR

This application claims priority of U.S. Provisional Patent Application Ser. Nos. 61/486,296, 61/486,297 and 61/486,299, all filed May 15, 2011, the disclosures of which are all incorporated by reference in their entireties.

FIELD

This invention relates to ion implantation and, more particularly, to ion implantation for precision material modification.

BACKGROUND

Ion implantation is a standard technique for introducing material into a workpiece. A desired implant material is ionized in an ion source, the ions are accelerated to form an ion beam of prescribed energy, and the ion beam is directed at the surface of the workpiece. The energetic ions in the beam penetrate into the bulk of the workpiece material and affect both the surface and depth of the workpiece material under certain conditions.

While ion implantation is typically used to alter the electrical properties of a workpiece, it can also be used to affect other material properties, such as resistance to specific chemicals, adhesion, hydrophobicity, hydrophilicity, and others.

Inkjet printing is a technique that ejects liquid ink onto paper. The inkjet print head (or cartridge) has nozzles that are about the size of a needlepoint through which the ink is ejected. FIG. 1 is a view of an embodiment of an inkjet printer head 1. In some embodiments, such as that shown in FIG. 1, the head 1 may include multiple nozzles 2 to accommodate a plurality of colored inks 3. The printing process may involve a nucleation step using the ink, bubble growth, ejection of an ink drop, and refilling of the inkjet head.

Printing resolution and lifetime are both limited by the inkjet aperture size. Smaller apertures can provide higher resolution, but the lifetime is reduced due to clogging of the aperture with the ink. Applying inkjet printing to new fields such as, for example, biochips, metal wiring, liquid crystal displays (LCDs), organic light-emitting diodes (OLEDs), or MEMS devices is being investigated. However, suitable printing heads are required for each application before widespread adoption can occur. For example, ejection of high viscosity ink droplets may need to provide high precision, high frequency, no chemical reaction, and no clogging. Thus, it may be beneficial to affect the properties of the material used to create the print head to minimize the interaction between the ink and the print head.

Another application where affecting material properties may be beneficial is MEMS and NEMS devices. MEMS devices relate to small mechanical devices driven by electricity. NEMS devices relate to devices integrating electrical and mechanical functionality on the nanoscale. Examples of these devices are accelerometers and gyroscopes, though there are countless others. MEMS and NEMS processing is extremely complex. One difficulty is that precise material modification to locally affect material properties has not been effectively demonstrated.

In addition, many materials would benefit from increased or modified chemical resistance. High energy ion implantation has been used in the past to affect chemical resistance of some materials. High energy implants may be time-consuming and may lead to increased manufacturing costs. These high energy implants also typically used exotic species such as Al, Mg, or Ti, which may be expensive. Furthermore, previous methods only treated a thick layer on the surface of the material and in some instances hardened the surface, which affected flexibility of the material.

Therefore, in each of these examples, it would be beneficial to have an improved method of precisely affecting material properties. Such an improved method could then be applied to various technologies, including inkjet printing, biochips and MEMS and NEMS devices, such as accelerometers, pressure sensors and gyroscopes.

SUMMARY

Methods of affecting a material's properties through the implantation of ions, such as by using a plasma processing apparatus with a plasma sheath modifier. In this way, properties such as resistance to chemicals, adhesion, hydrophobicity and hydrophilicity, may be affected. These methods can be applied to a variety of technologies. In some cases, ion implantation is used in the manufacture of printer heads to reduce clogging by increasing the material's hydrophobicity. In other embodiments, MEMS and NEMS devices are produced using ion implantation to change the properties of fluid channels and other structures. In addition, ion implantation can be used to affect a material's resistance to chemicals, such as acids.

BRIEF DESCRIPTION OF THE DRAWINGS

For a better understanding of the present disclosure, reference is made to the accompanying drawings, which are incorporated herein by reference and in which:

FIGS. 9A-D show a representative sequence to treat an inkjet print head.

DETAILED DESCRIPTION

The embodiments are described herein in connection with specific materials and devices, but these embodiments should not be limited merely to the materials and devices listed. For example, some of the embodiments are described herein in connection with MEMS and NEMS, but these embodiments also may be used with other devices. Similarly, some of the embodiments are described herein in connection with printers such as inkjet printers, but these embodiments also may be used with other printing devices. These inkjet printers or other printing devices can be used for paper or other applications known to a person skilled in the art. While a specific type of implanter is disclosed, other ion implantation systems known to those skilled in the art that can focus an ion beam or that can implant particular regions of a workpiece with or without a mask on, above, or a distance from the workpiece also may be used in the embodiments described herein. While the term "hydrophobic" is used, throughout, it may be advantageous to render a surface hydrophilic instead. Thus, the invention is not limited to the specific embodiments described below.

While a beamline or plasma doping tool may be used to implant ions to affect a material's properties, a plasma processing apparatus having a plasma sheath modifier may be used. This has an advantage that selective implantation of 2D or 3D surfaces may be performed without using photoresist, other hard masks, or proximity masks. This sort of patterned implant reduces processing time and manufacturing costs. Scanning the workpiece or device to be implanted may be combined with biasing such a workpiece or device or changing the plasma parameters to accomplish this selective implantation.

Figure 1:
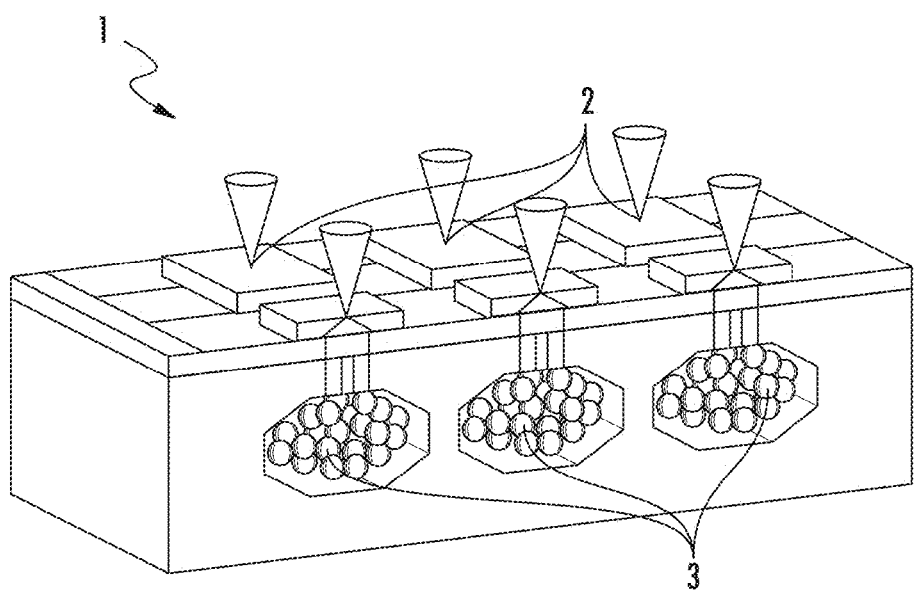
FIG. 1 is a view of an embodiment of an inkjet printer.
Figure 2:
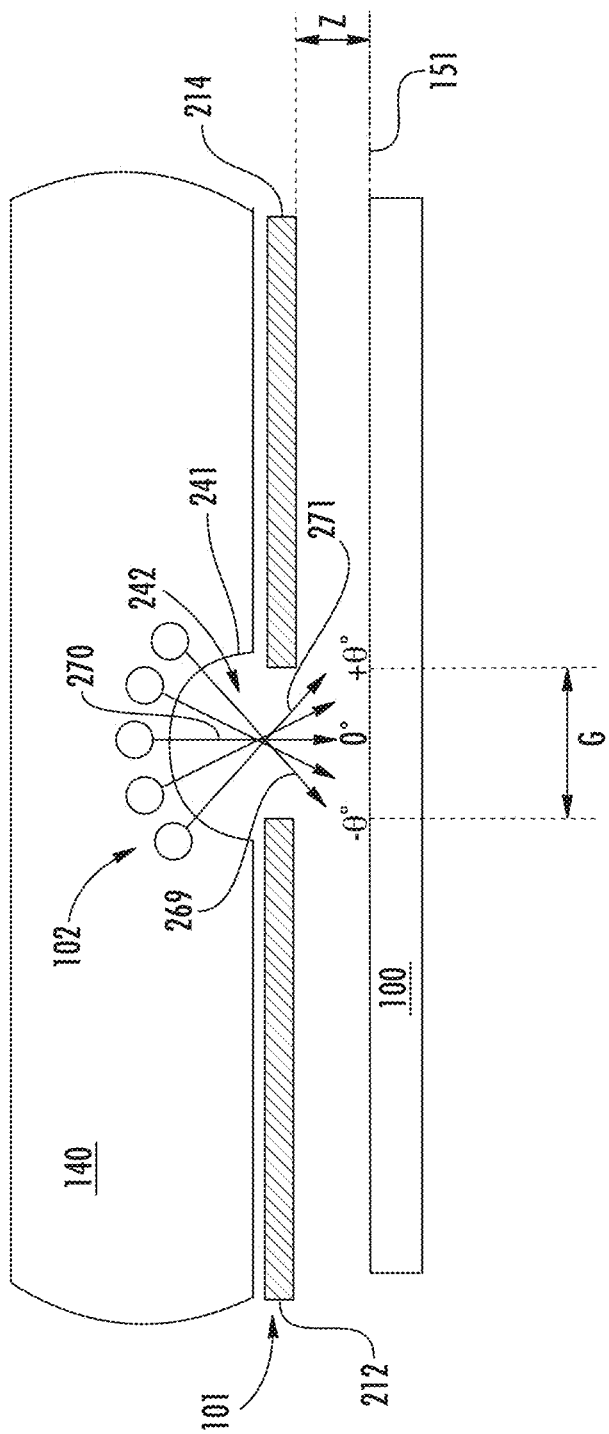
FIG. 2 is a block diagram of a plasma processing apparatus having a plasma sheath modifier.

FIG. 2 is a block diagram of a plasma processing apparatus having a plasma sheath modifier. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 102 from the plasma 140 are attracted toward a workpiece 100. These ions 102 may be attracted with sufficient energy to be implanted into the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The plasma sheath modifier 101 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. This plasma sheath modifier 101 may be referred to as, for example, a focusing plate or sheath engineering plate.

In the embodiment of FIG. 2, the plasma sheath modifier 101 includes a pair of panels 212 and 214 defining an aperture there between having a horizontal spacing (G). The panels 212 and 214 may be an insulator, semiconductor, or conductor. In other embodiments, the plasma sheath modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the plasma sheath modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 212 and 214 at a large range of incident angles. For instance, ions 102 following trajectory path 271 may strike the workpiece 100 at an angle of +θ° relative to the plane 151. Ions 102 following trajectory path 270 may strike the workpiece 100 at about an angle of 0° relative to the same plane 151. Ions 102 following trajectory path 269 may strike the workpiece 100 an angle of −θ° relative to the plane 151. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (θ) may be between +60° and −60° centered about 0°.

The plasma processing apparatus of FIG. 2 can be used to affect the properties of a material. This technique can then be applied to various technologies, as described in more detail below.

Figure 3:
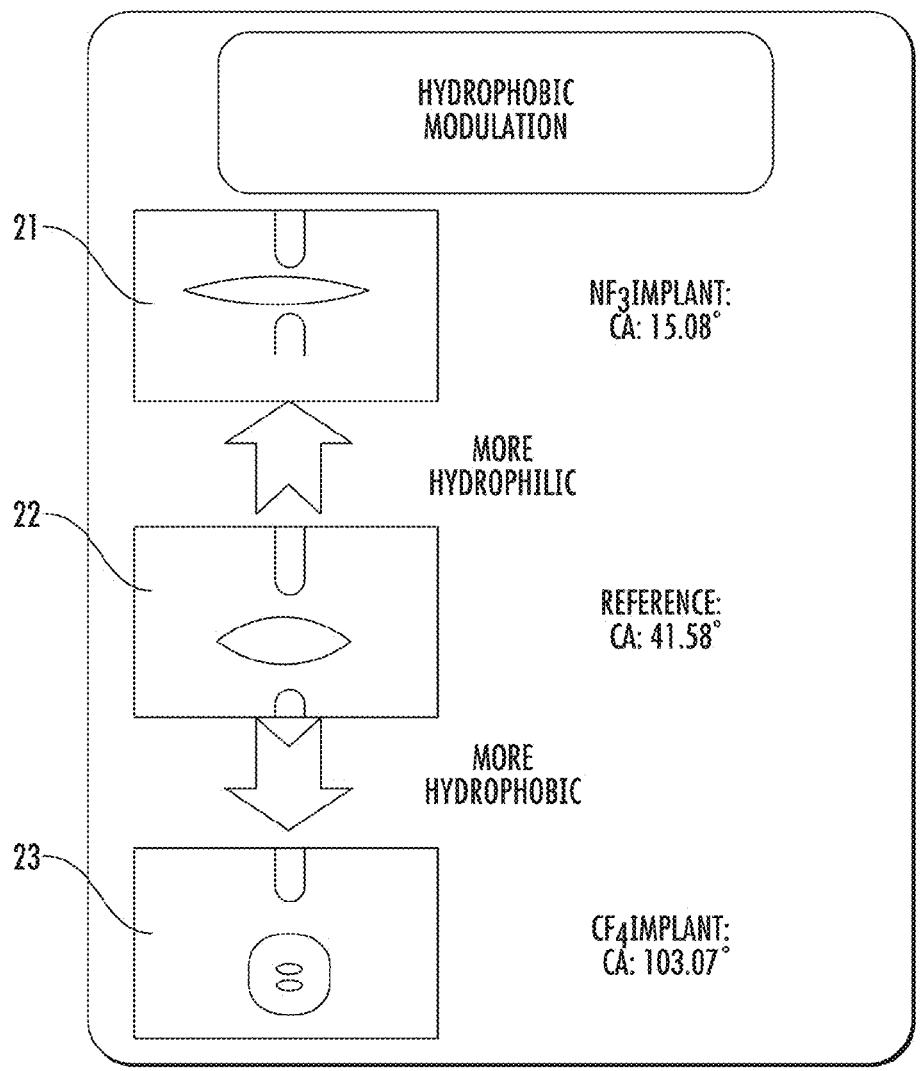
FIG. 3 illustrates hydrophobic modulation.

In one embodiment, use of multi-angle ion implantation can modify the property of a nozzle, channel, and inkjet printer head. These may be fabricated of, for example, silicon, polymers, semiconductors, poly(dimethylsiloxane) (PDMS), SU8 photoresist or conductors. FIG. 3 illustrates hydrophobic modulation can be caused by ion implantation. The hydrophobicity of a surface was modulated after implants of $NF_3$ and $CF_4$ using a plasma doping tool. A reference material, shown in the center of FIG. 3, has an initial contact angle of 41.58°. The accompanying illustration 22 depicts the shape of a droplet on the material. By implanting the material with $NF_3$, the contact angle was reduced to 15.08°, indicating that the material has become more hydrophilic. As shown in the upper illustration 21, the droplet is more spread across the surface of the material. Conversely, the bottom illustration 23 shows the effect of a $CF_4$ implant. In this case, the contact angle increases to 103.07°, indicating a high degree of hydrophobicity. Using a multi-angle ion implant can enable changing the hydrophobic or porosity properties of either a 2D or 3D surface. This will allow the correct inkjet droplet properties for a particular printing application.

As shown in FIG. 3, ion implant can change a surface to be hydrophobic or hydrophilic. Thus, the adhesion of the ink droplets to the surface can be changed. The chemical compatibility or chemical resistance of the surface also can be altered by physical changes to the implanted surface caused by ion implantation. Finally, different liquids may become suitable as inks using inkjet printing (polymers, special inks, metals, oils, nanoparticles, or others) by affecting adhesion or chemical compatibility. Besides enabling new printing applications, all this may lead to higher inkjet printer nozzle lifetimes.

Figure 4:
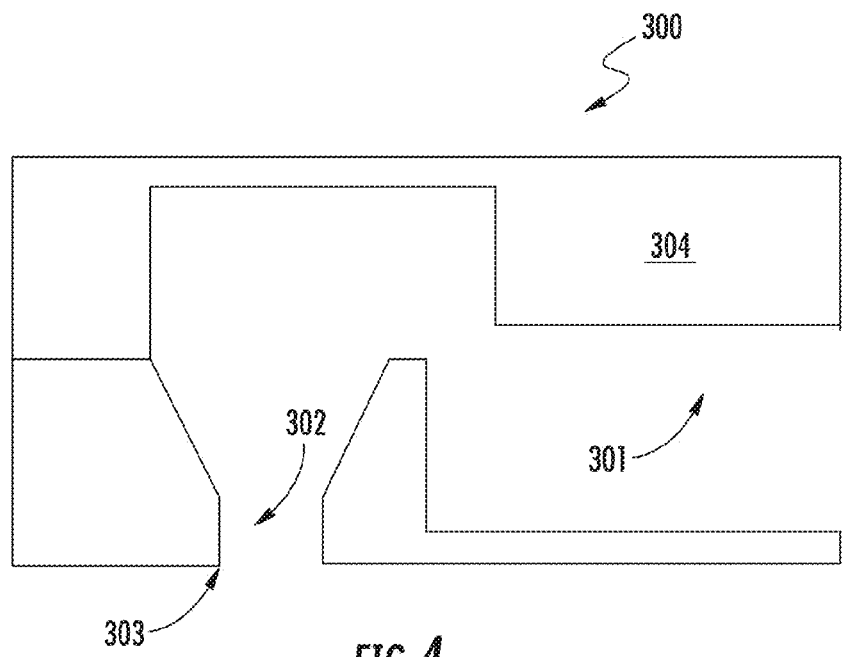
FIG. 4 is a cross-sectional side view of an embodiment of a print head.

FIG. 4 is a cross-sectional side view of an embodiment of a print head. Other designs known to those skilled in the art are possible. In one instance, the print head 300 is fabricated from a silicon workpiece through processes such as etching. The silicon devices or parts produced are then bonded to a cover 304 using an adhesion layer. This cover 304 may be metal, glass, $SiO_2$, Si, PDMS, or SU8. In another instance, the print head 300 is made of plastic.

The print head 300 has multiple surfaces. It has a channel 301 that leads to the nozzle 302. It also has an exit area 303, where the nozzle 302 meets the external environment. All or some of the surfaces of the channel 301, the nozzle 302 and the exit area 303 may be implanted. These surfaces may be implanted with, for example, C, N, H, F, He, Ar, B, As, P, Ge, Ga, Si, Zn, Al, other noble gases, other p-type or n-type dopants, or other atomic or molecular species known to those skilled in the art. The implant depth may be less than 100 nm or, more particularly, between approximately 1 nm and 30 nm, with a surface peak or retrograde profile to modulate the surface energy.

In one instance, the entirety of the surfaces that contact the ink in the print head 300 is implanted. With a blanket implant, a multi-angle implant can enable implantation of a 3D structure. The nozzle 302 and the sidewalls and bottom of channel 301 may be implanted. The lower surface of the glass cover 304 also may be implanted. This enables liquid to flow without adhering or sticking to the bottom, sides, or top of the channel 301 or nozzle 302.

In another instance, only a portion of the surfaces that contact the ink in the print head 300 is implanted. This portion may coincide with areas where clogging is common, where ink transport is desired, or other areas. In one particular embodiment, any corners of the print head 300 are implanted to prevent ink from being retained. The corners also may be implanted with a higher dose than other regions of the print head 300.

Implanting the area where adhesion occurs between, for example, silicon and glass parts of the print head 300 may affect bonding between these two parts. Photoresist or selective implants may prevent this from occurring. In another instance, a selective implant is performed to render certain surfaces hydrophobic while a second selective implant is used to improve or enable the bonding step between the various workpieces.

The implant will reduce or prevent adhesion by the ink to the print head 300. The ion species that is implanted may in part affect the hydrophobicity, as shown in FIG. 3. Certain energy levels or doses during implantation may modify the lattice structure of the surfaces of the print head 300 in FIG. 4, which also may in part affect the hydrophobicity. Other mechanisms due to implant that affect the hydrophobicity may be possible. Since these regions are implanted, they will remain hydrophobic even if cleaned because these implanted regions are an integral part of the surface of the print head 300 instead of a coating on the surface of the print head 300 that may be eroded or washed off. To maintain the hydrophobic state, at least a few monolayers of the surface are implanted. Uniformity of the dose and depth implanted regions may be controlled. If certain areas of the surface are implanted in a non-uniform manner or are not implanted at all, this may affect adhesion of the ink. In one embodiment, $CF_4$ is implanted at energies between 0.5 and 6.0 kV. In a further embodiment, the voltage is decreased over time to improve adhesion and provide interface mixing between the starting material and the new layer being created. In some embodiments, this material is implanted. In other embodiments, the material may be implanted and deposited.

In some instances, the inkjet printer head may need to be implanted to affect different regions in opposite ways. For example, referring to FIG. 9D, the ink is stored in an ink chamber 351. The path from the ink chamber 351 to the external environment passes through a nozzle 352, and ultimately through an exit area 353. Two important aspects of an inkjet print head 350 are the ability for the ink droplets to travel through the ink chamber 351 and nozzle 352 with minimal impedance, and the ability of the ink to not adhere to the exit area 353, thus causing unwanted stains on paper and a clogged nozzle. These requirements demand that the interior of the nozzle 352 has the highest ink wettability and the outside surface near the exit area 353 has the lowest ink wettability. Current practices often rely on materials selection combined with CVD/PVD processes to deposit a wetting and/or anti-wetting layers on these surfaces. These types of surface treatment often have poor adhesion between surface deposition and the substrate, and can be difficult to apply to the small nozzle features without clogging the orifice. According to one embodiment, ion implantation technology is utilized, which produces high-strength interfaces with long service life time. Ion implantation can be precisely controlled, making it possible to fine tune wettability on different parts of the inkjet print head 350. In addition, ion implantation can be used to process features in nanometer scales with excellent uniformity and is compatible with the existing microelectronics manufacturing processes. Ion implantation also enable longer lifetime of the inkjet print head 350.

In operation, the print heat 350 is formed from a processed workpiece 354 and a cover 358. The cover 358 may be glass or some other material and is applied to the workpiece 354 after processing. Referring to FIG. 9A, the workpiece 354 may be of any suitable material, including silicon. The workpiece 354 may be etched to form the nozzle 352, as shown in FIG. 9B. The nozzle 352 may be formed so as to be wider at the top surface 356 than at the exit area 353, which is defined as the area where the nozzle 352 meets the bottom surface. Often the dimension of the nozzle 352 is limited by the tendency of the ink to clog. After etching, it may be desirable to make the nozzle 352 hydrophobic. Thus, as shown in FIG. 9C, a focused ion implant 355 using the plasma processing apparatus of FIG. 2, for example, may be used to make this nozzle area 352 hydrophobic. As described earlier, an implant of $CF_4$ may be used. In some embodiments, the exit area 353 is made to have a different level of hydrophobicity than the rest of the nozzle 352. In some embodiments, the hydrophobicity may be varied by controlling the implant angle of the ions. This may also be done by performing another ion implant from the top surface 356, or may be done via an ion implant from the bottom surface. Furthermore, in some embodiments, the rest of the top surface 356 may be treated to change the hydrophobicity of the top surface 356. For example, the rest of the top surface 356 may be less hydrophobic than the nozzle 352. After the implantation is performed, the print head 350 can be assembled by attaching the cover 358 to the workpiece 354, as shown in FIG. 9D.

The implanted region may densify the material of which the surface is composed. This densification is due to the material added to the lattice of the surface during implantation. The densification may affect hydrophobic or hydrophilic properties of the surface. For example in the case of polymer based MEMS/inkjet heads, such as PDMS and SU8, the implantation may break some of the bonds of the polymer and create a graphitic skin layer, which is denser than the original polymer. This can be done using inert gas or active species, such as carbon-based species.

Another application that would beneficial from affecting material properties is electromechanical devices, such as MEMS and NEMS devices. These devices use polymers of various designs and for various purposes. These polymers include, for example, SU8 photoresist, PDMS, polymethyl methacrylate (PMMA), or others known to those skilled in the art. All or part of the polymers may be frozen (i.e. the shape of the feature will not change after implantation) or hardened using ions. For example, in the case of implantation of resist, a conformal implant can freeze the resist such that it is capable of going through two litho processes for dual patterning lithography. In one instance, only part of a 2D or 3D polymer structure in a MEMS or NEMS device is implanted. For example, in a micro-valve, the fluid channel can be hardened or rendered more resistant to a liquid though implantation. The micro-valve membrane may be implanted with a different species or not implanted at all such that it does not get jammed. Thus, localized implantation and control of localized implantation is important both due to the scale of the devices and the different functions of these devices. This polymer hardening or freezing may involve implantation of inert species such as a noble gas or an active species such as Si, $NF_3$, $C_xH_y$, $C_xF_y$, $SiF_4$, $SiH_4$, disilane or $CF_4$. Of course, other species can be implanted.

MEMS and NEMS devices also may need sidewall smoothing. Masking steps or other processing steps may cause a large amount of roughness. Smoothing the sidewalls of, for example, a polymer can improve MEMS or NEMS device performance. A noble gas may be implanted to a depth between 1 nm and 100 nm, for example, and cause physical changes to the sidewall surface. Similar to polymer freezing or hardening, localized implantation and control of localized implantation is important both due to the scale of the devices and the different functions of these devices.

Metal films in the MEMS or NEMS device can be implanted to modulate the stress. These metal films may be extremely small. Patterned or selective implantation of these metal films can be accomplished without implanting neighboring or adjacent areas of the MEMS or NEMS device.

Localized processing of a MEMS or NEMS device can affect physical properties. For example, as described above for print heads, the hydrophobicity or porosity can be adjusted in all or part of a NEMS or MEMS device using ion implantation on either a 2D or 3D surface. The surfaces may be implanted with, for example, C, N, H, F, He, Ar, B, As, P, Ge, Ga, Si, Zn, Al, other noble gases, other p-type or n-type dopants, or other species known to those skilled in the art. These may be atomic or molecular ions that contain, for example, the ions previously listed or other species known to those skilled in the art.

In one instance, the entirety of a surface is implanted. In another instance, only a portion of a surface is implanted. For example, in a biochip or microfluidics device, a channel or region where a fluid will flow or collect can be implanted. This will affect whether the fluid adheres to the surface. Thus, to improve performance of a device, it may be desirable to identify regions where fluids pass, or are likely to get clogged. These identified regions can then be ion implanted to affect their hydrophobicity, reducing risk of clogging and improve device performance.

Figure 10:
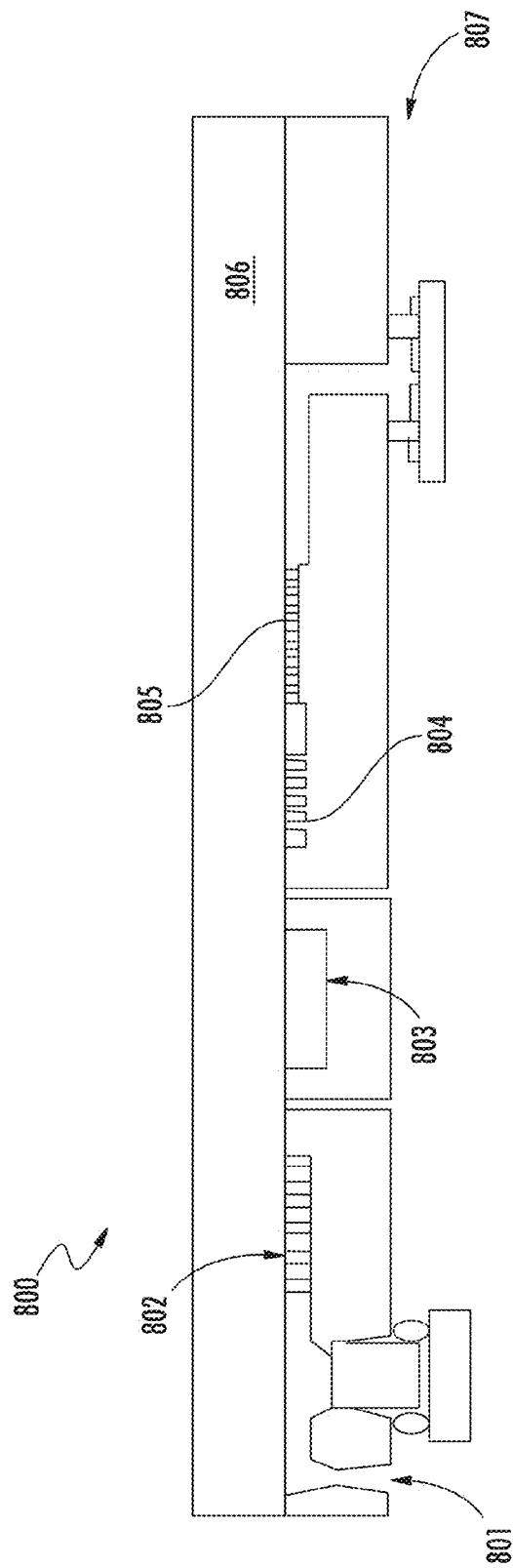
FIG. 10 represents a typical biochip.

FIG. 10 shows a representative biochip. The biochip 800 may be used for single nucleotide polymorphism (SNP) detection in DNA. The biochip 800 includes a variety of different functions, which are physically separated in the device 800. For example, fluids may enter the device 800 via an entrance 801. This fluid may pass through a meander mixer with obstacles 802. After sufficient mixing, the fluid enters a thermal chamber 803. After being heated, the fluid enters a filter section, including a coarse filter 804 and a fast and selective micropillar filter 805. These sections are each created by processing a suitable workpiece 807. After the workpiece 807 is processed, it is covered, such as by a glass plate 806.

These different functions within the device 800 may have differing requirements. For example, to enhance the mixing ability, it may be beneficial to affect the properties of the material in the meander mixer, but not in other areas. Furthermore, enhanced mixing may occur if the hydrophobicity within different regions of the meander mixer differ. A focused or patterned ion implant to selectively affect the hydrophobicity (or hydrophilicity) of various portions of the material in the meander mixer may enhance mixing. Similarly, the micropillar filter 805 may benefit from increasing hydrophobicity. Since the micropillars are very small features with high aspect ratio, conformally coating each of them, as is currently done, is ineffective. A conformal ion implant, using the apparatus of FIG. 2, may affect the material properties without increasing the size of the individual micropillars. This ion implant enables a better control of the conformal treatment and the adhesion of the treatment to the micropillar with minimal increase of micropillar size. In addition, it may be advantageous to not affect the properties of other parts of the biochip 800. For example, the thermal chamber 803 may not be treated at all. Of course, other variations are also possible. This only serves to illustrate the ability to selectively affect a material's properties on a very small scale to improve device performance. In addition, it would be advantageous if these treatments do not affect the bonding of the workpiece 807 to the glass cover 806. These precise treatments of the regions may be important in this respect.

Figure 11:
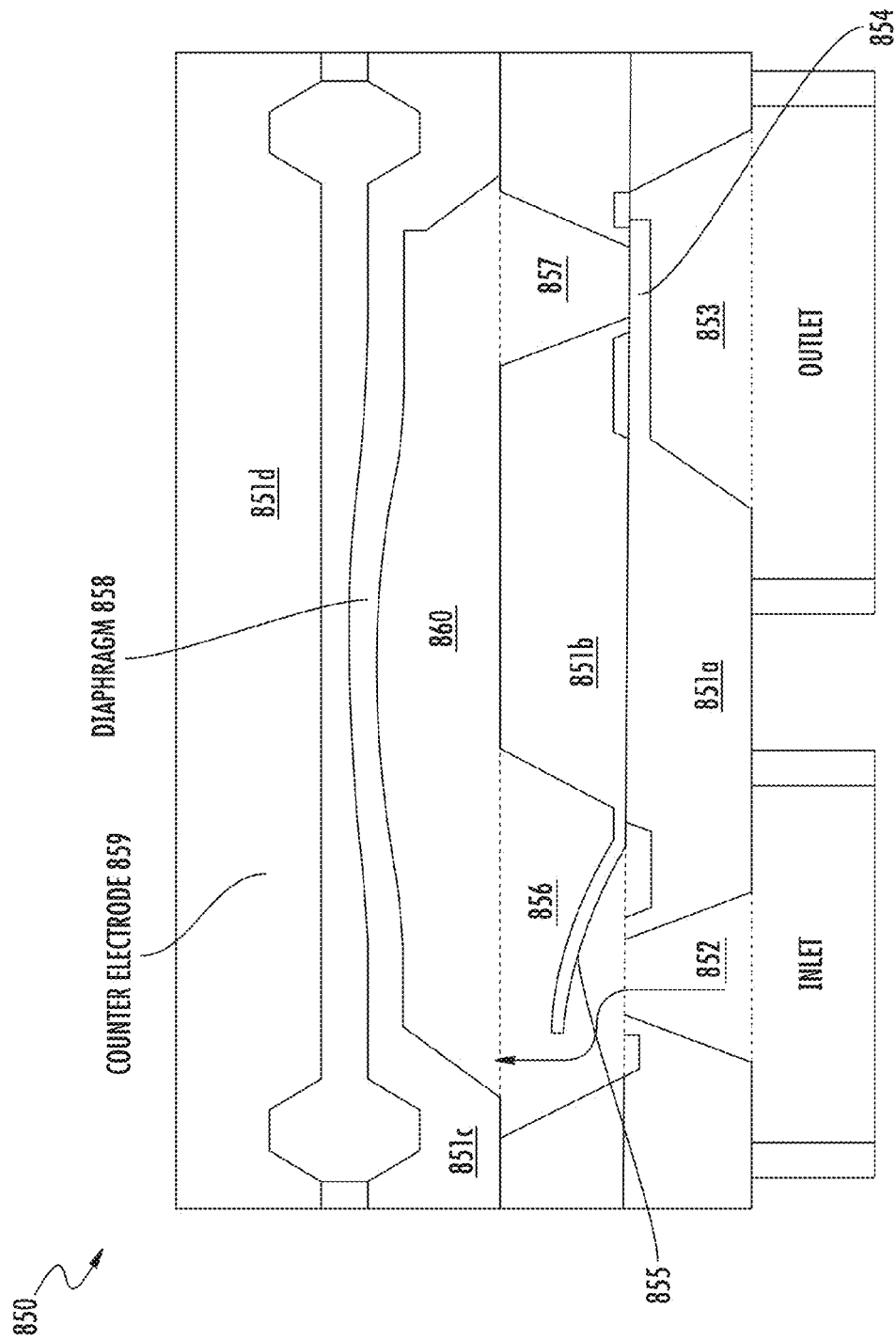
FIG. 11 represents a micropump.

FIG. 11 shows another example of a MEMS device 850. This device is a micropump, and includes a number of individual workpieces 851a-d which all affixed to each other after processing to form the pump 850. The lower workpiece 851a includes an inlet area 852, an outlet area 853 and an outlet membrane, or flap 854. The first intermediate workpiece 851b includes an inlet membrane or flap 855, an inlet area 856, and an outlet area 857. The second intermediate workpiece 851c has a movable diaphragm 858. The top workpiece 851d has a counter electrode 859. In operation, the diaphragm 858 moves upward, creating a partial vacuum in the chamber 860. This causes liquid to push the inlet membrane 855 upward, allowing fluid to pass through the inlet areas 852, 856 and into the chamber 860. When the diaphragm 858 moves downward, it forces the fluid in the chamber 860 to push the outlet flap 854 downward, allowing the fluid to exit the outlet areas 857, 853. For proper operation, it may be beneficial to affect those parts of the device which are movable, such as the material that comprises the inlet membrane 855 and the outlet flap 854. It may be beneficial to insure that these portions do not adhere to the other portions of the workpieces 851a-d. This may involve changing the adhesion properties or hydrophobicity of the membranes 854, 855, or the portions of the workpieces that contact these membranes 854, 855. It may also be beneficial to treat the diaphragm 858 to insure that it does not adhere to the counter electrode 859. Alternatively, the counter electrode 859 may be treated. In some embodiments, treatments for the micropump are focused only on a portion of the workpiece so that other portions are not treated at all, or may receive a different treatment.

As described above, the implant will reduce or prevent adhesion by a fluid. The ion species that is implanted may in part affect the hydrophobicity. Certain energy levels or doses during implantation may modify the lattice structure of the surfaces, which also may in part affect the hydrophobicity. Other mechanisms due to implant that affect the hydrophobicity may be possible. The implanted regions will remain hydrophobic even if cleaned because the implanted regions are part of the surface instead of a coating on the surface that may be eroded or washed off. To maintain the hydrophobic state, at least a few monolayers of the surface may be implanted. Uniformity of the dose and depth implanted regions may be controlled.

MEMS and NEMS devices can include any micro or nano mechanical device. This includes accelerometers, gyroscopes, sensors, micro-actuators (such as micro-pumps, micro-flaps, micro-valves, optical switches, or mirrors), thermalactuators, micromirrors, micro-resonators, piezoelectric detectors, cantilevers, microbalances, pressure sensors, bioMEMS, biosensors, chemosensory, microphones, electrostatic motors, microfluidics devices, interferometric modulator displays, pico projectors, RF MEMS antennas, RF filters, RF MEMS phase shifters, or other devices. Other localized blanket or patterned implants, etching, or deposition steps also can be performed on a MEMS or NEMS device. Electrical, optical, or magnetic properties also can be affected by these implants or treatments. Focused multi-angle processing can be performed on a 2D or 3D device. In some instance, localized regions down to approximately 5 µm feature size can be treated.

Figure 5:
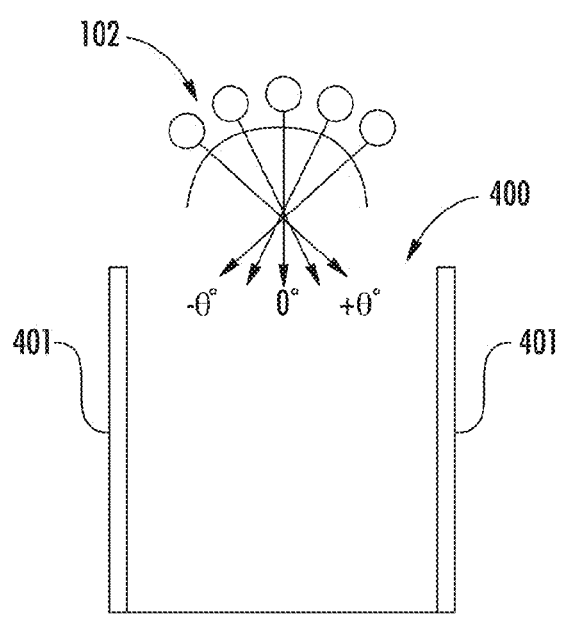
FIG. 5 is a cross-sectional side view of sidewall porous material formation.

While much of this disclosure describes implanting ions into a surface, the disclosure is not limited to this embodiment. For example, the apparatus of FIG. 2 may be used to add coatings or layers to an existing feature or structure. FIG. 5 is a cross-sectional side view of sidewall porous material formation. Certain MEMS and NEMS devices require sidewall porous material formation, but the small dimensions make deposition difficult. For example, silicon, porous silicon, diamond-like carbon, or other materials may be formed on a sidewall. Ions 102 are used to form a layer 401 on the sidewalls of the feature 400. The layer 401 may be between 5 nm to 100 nm thick, for instance. This can be performed by adjusting the angles of the ions 102. In some instances, forming a layer on the base of the feature 400 or only on one sidewall of the feature 400 is possible. Different thicknesses of the layer 401 are possible on different surfaces by adjusting the angle spread of the ions 102 or the relative doses within the angle spread of the ions 102.

Figure 12:
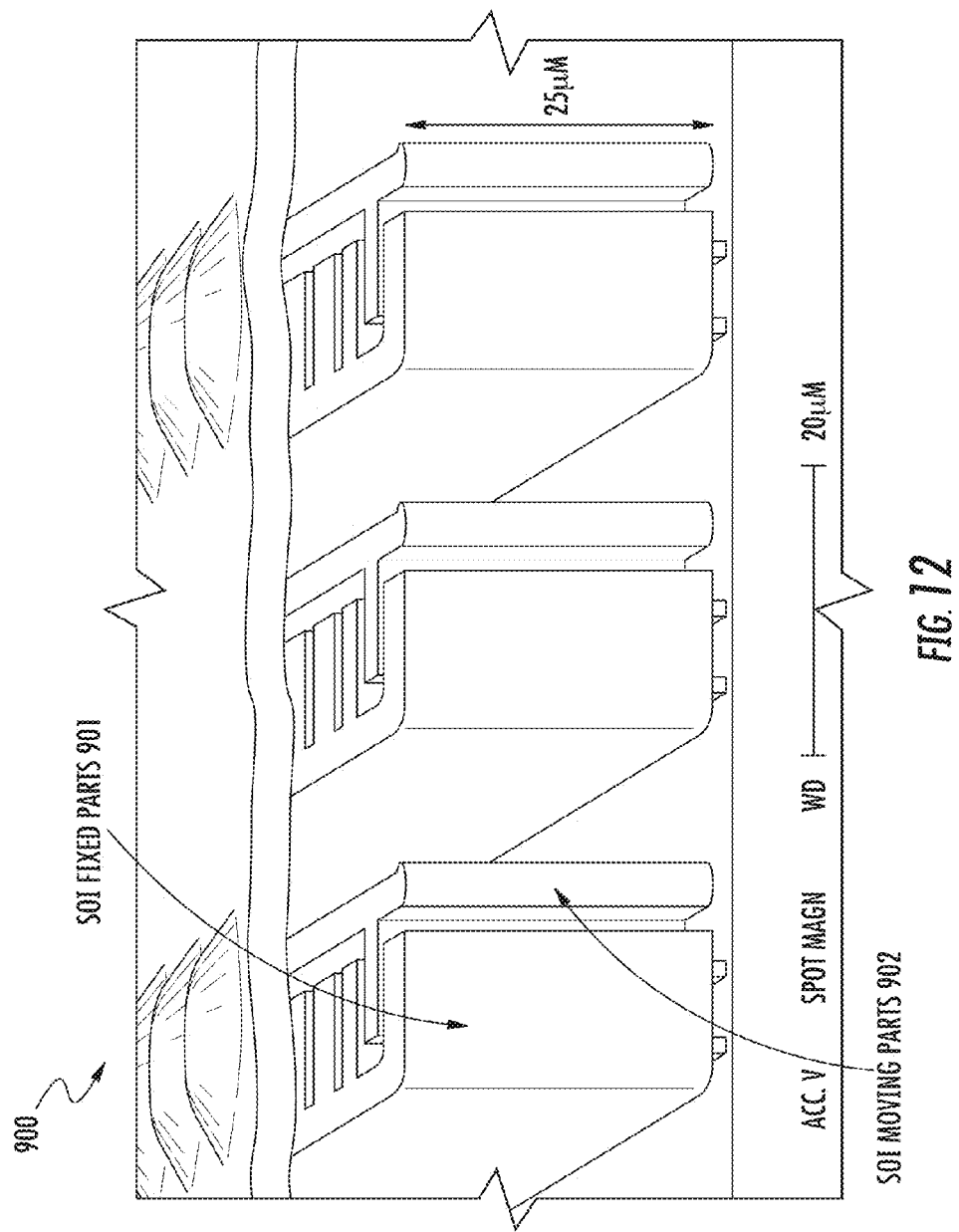
FIG. 12 is an exploded view of the internals of an accelerometer.

This porous material formation may occur on many types of device. For example in one embodiment, the sidewalls of an accelerometer 900 are treated to add porous material, as shown in FIG. 12. Capacitance, or sensitivity, of an accelerometer is proportional to surface area. Increased surface area of the accelerometer sidewall can make it more sensitive to movements. Since porous materials have a much larger surface area than planar surfaces, this can significantly increase the sensitivity of the device 900. In some embodiments, one or both of the SOI fixed parts 901 and the SOI moving parts 902 are treated to add porous material on their sidewalls.

Porous material deposition can be used to form a protective layer around a device. In one embodiment, devices intended for placement in the body may be coated using the apparatus of FIG. 2 to make them biocompatible. Devices can also be coating to change other properties, such as hydrophobicity.

In yet other embodiments, it may be beneficial to use ion implantation to affect the material's resistance to various chemicals. In one embodiment, the treatment disclosed herein uses a low energy implant, which is faster and less complex than a high energy implant. These embodiments also only may affect the first 0 to 100 nm of a material, though other depths are possible. By only affecting a small layer of the implanted material, less of the overall material will have its properties changed and the flexibility of the material is not negatively impacted. Thus, the properties at the surface of the material may be affected without affecting the entire workpiece. This may be advantageous, in that it is possible to change the chemical resistance of some materials or devices without affecting their flexibility.

Figure 6:
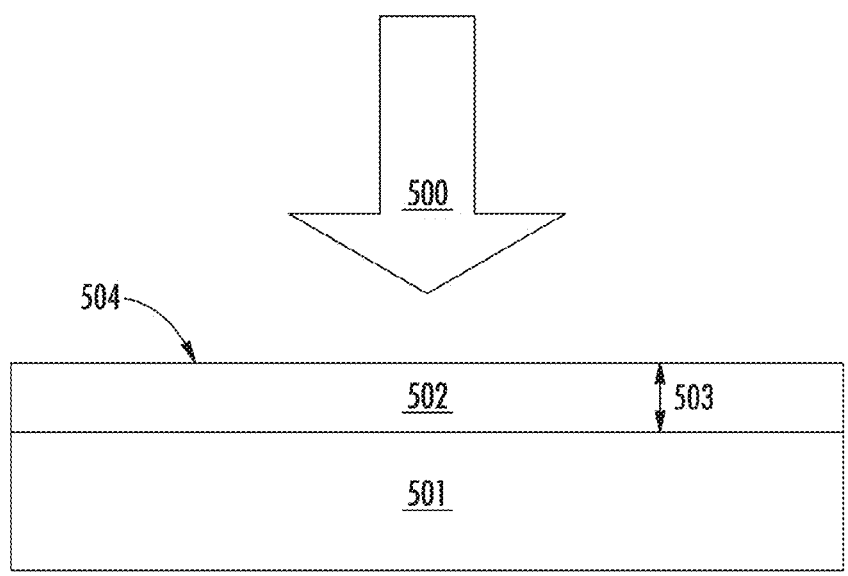
FIG. 6 is a cross-sectional side view of a workpiece being implanted.

FIG. 6 is a cross-sectional side view of workpiece being implanted. The workpiece 501 may be composed of, for example, polymer, glass, plastic, insulators, metals, or other materials. While the workpiece 501 may have a 2D or planar surface 504 as illustrated in FIG. 6, this implant also can apply to 3D structures. With such a 3D structure, a multi-angle implant can treat all surfaces of the 3D structure. Also, while the entire surface 504 is illustrated as being treated with the ions 500, a selective or patterned implant may be performed. A selective implant will scan the surface 504 with respect to the ions 500 and adjust the bias to the surface 504 (or workpiece 501 containing the surface 504) or plasma conditions such that only a portion of the surface 504 is implanted.

The ions 500 form an implant region 502 that penetrates the surface 504 of the workpiece 501. The depth of the implant region 502 (i.e. dimension 503) may be between approximately 0 to 100 nm, for example. The implant profile can be Gaussian or a surface peak to accommodate different chemical resistance properties. The ions 500 may be, for example, a noble gas or other inert species, though other species are possible. In one instance, the ions 500 are Ar, Ne, Kr, Xe or He and these ions break some of the bonds on the surface 504 and in the implant region 502 that make this surface 504 sensitive to certain chemicals. Thus, the workpiece 501 has its surface properties altered. Cross-linking of the surface 504 also may be affected by the low energy implantation. For example, lactone or ester groups of a polymer can be destroyed using such a low energy plasma treatment. In yet another embodiment, an active species is used for the implant, such as $N_2$, $H_2$, $NF_3$ $C_xH_y$, $C_xF_y$, $SiF_4$, $SiH_4$, disilane or $CF_4$. This active species can be implanted to cause a chemical change in the surface 504. This may be used instead of or to supplement the physical changes caused by the implant.

Figure 13:
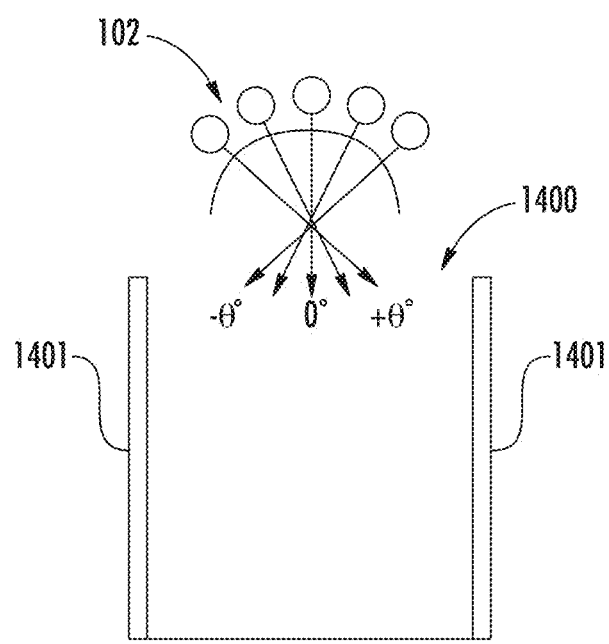
FIG. 13 is a cross-sectional side view of one embodiment of a 3D structure or feature being implanted.

FIG. 13 is a cross-sectional side view of one embodiment of a 3D feature 1400 being implanted. The incidence angles of the ions 102 are used such that implant regions 1401 are formed only on the sidewalls of the 3D structure 1400. Of course, only the base of the 3D structure 1400 may be implanted in an alternate embodiment. In yet another embodiment, the sidewalls and base of the 3D structure 1400 are implanted to different depths or with different doses. This can be accomplished, for example, by adjusting the angle spread of the ions 102 or relative doses of ions 102 within the angle spread. Other 3D structures are possible and selective implant can be performed on only some surfaces while other surfaces are not treated. In some cases, only one side of the feature needs to be implanted. An example of this may be MEMS sensors.

In one particular embodiment, a sealing layer is placed on a surface using a helium (He) implant. This implant with He reduces sputtering and damage to the areas below the implant region. In one instance, this can be used with polymers. This sealing layer may be between 1 nm and 30 nm in one instance and may break some bonds of the surface to change the local composition.

Figure 7A:
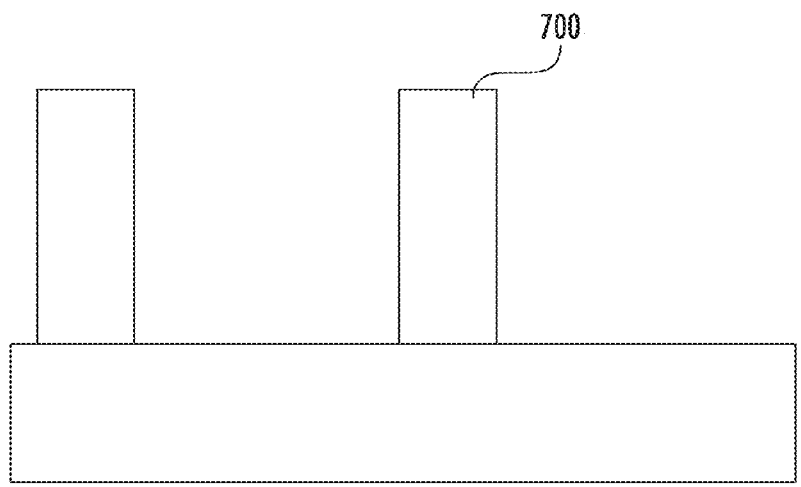
FIGS. 7A-B represents an embodiment of helium implantation into a structure.
Figure 7B:
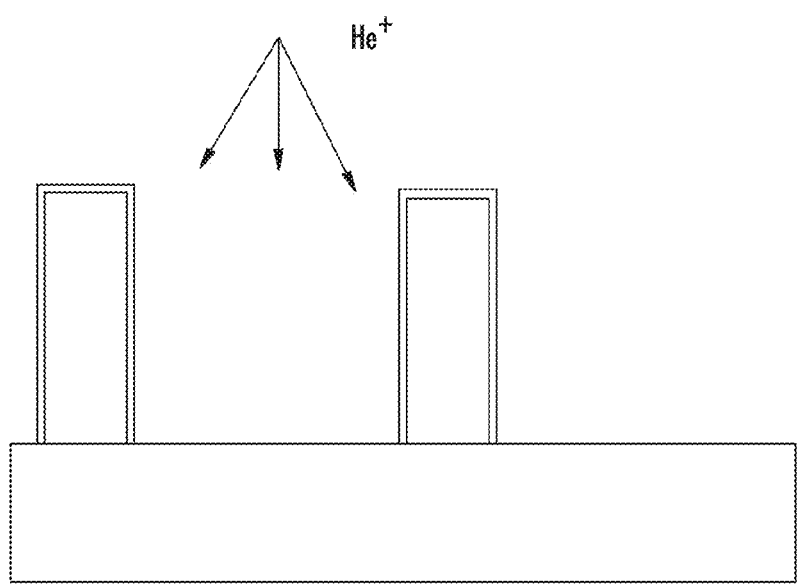

Experiments have shown that implanting He into a polymer layer can affect chemical resistance. In the experiment, the polymer was not resistant to acetone prior to the implant but was resistant to acetone after the implant. FIGS. 7A-B represents an embodiment of He implantation into a structure.

Figure 8A:
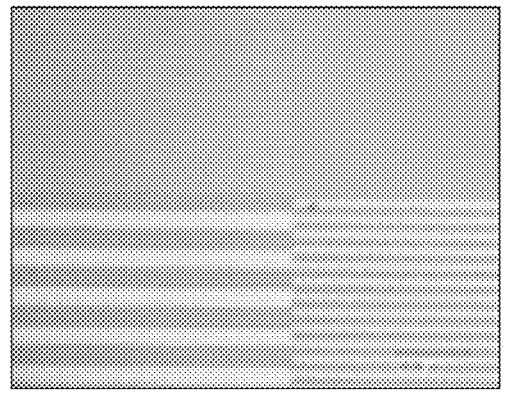
FIGS. 8A-C show the results of implantation according to FIG. 7.
Figure 8B:
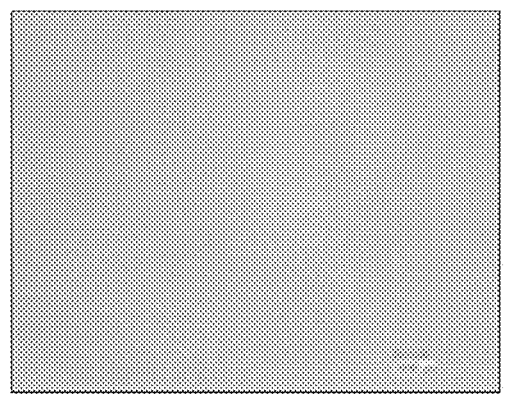
Figure 8C:
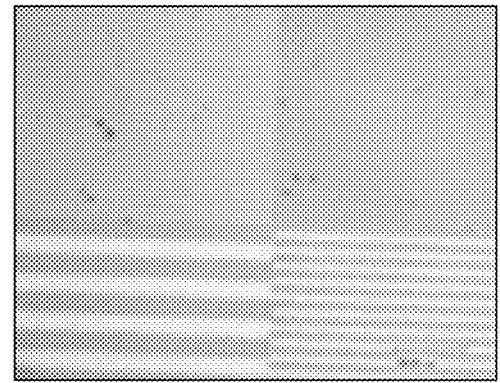

In FIG. 7A, the polymer, in this case photoresist, is patterned. In this embodiment, the photoresist patterning comprises a series of vertical walls 700. In FIG. 7B, the photoresist is then implanted with helium to harden the polymer. FIG. 8A shows the patterned photoresist. Vertical walls of various thicknesses are created on the workpiece. FIG. 8B shows a workpiece, which did not undergo the process of FIG. 7B, after a 5 second acetone rinse. Without treatment, the polymer was removed from the sample in acetone. FIG. 8C shows a workpiece, which underwent the process of FIG. 7B. With a He implant, the polymer remained intact after an acetone treatment. Thus, the pattern shown in FIG. 8C is the same as that of the unrinsed reference sample, shown in FIG. 8A. This He implant can be combined with $CF_4$ to make the resulting polymer hydrophobic as well.

The ability to affect chemical resistance has other important applications as well. For example, for industrial printing technology, such as solar metal contact printing, printed electronics, flexible electronics and other application, there is a need for solvent based ink. Because of this, the material used in the printer heads needs to be also compatible with these aggressive liquids. Traditional polymer based cavity and channel may not be compatible. Thus, by introducing an ion implantation, as described above, the hydrophobicity requirement may be maintained while increasing the resistance to chemicals, such as these inks.

In some embodiments, ultraviolet (UV) light can be used to improve the chemical resistance. Plasma often generates light at various frequencies. Therefore, the light and UV emitted from the plasma additionally can affect chemical resistance by breaking some of the bonds in the polymer. The frequency of the light may be tunable by using different extraction plate materials. In some embodiments, the extraction plate acts as a light filter, when different materials will have different transparencies. Thus, selection of an appropriate material for the extraction plate may change the frequencies which the polymer is exposed to. Therefore, if the materials that surround the plasma or are disposed between the plasma and the implanted workpiece can be selected to transmit certain types of UV light, this energy can supplement the implanted ions.

One advantage of some of the embodiments described herein is that feature dimensions of the structure or surface may the same after the implant. Unlike other treatments, one or more layers are not added to the surface. Instead, the surface itself is affected. A second advantage is that the ions can smooth a surface using certain implant parameters. This may or may not affect the dimensions of the surface. The scale of the smoothing can vary with the implant parameters.

Print heads, microfluidics, MEMS devices, NEMS devices or biomedical applications may need chemical resistance when designed to transport liquid from one region to another. This liquid may be an industrial chemical, water, a bodily fluid, or other material. These devices may be 3D structures with high aspect ratios. A third advantage is that the embodiments described herein can enable the dimensions to remain small (or totally unaffected) while providing total or patterned chemical resistance.

Although reference is made to MEMS devices, NEMS devices and inkjet printer heads, other devices also can benefit. For example, organic light-emitting diodes (OLEDs) can be treated between each organic layer. During production of OLEDS, a first organic layer is deposited by spin coating and then baked. A second organic layer is then deposited. The solvent from the second organic layer may attack the first organic layer. Therefore, implantation of the first organic layer to render it more chemical resistant can improve OLEDs. Other devices that transport or carry liquids or have interfaces between organic layers can also benefit.

In addition, other materials, such as gloves, boots, fabric, protective clothing, or protective equipment, can be rendered more resistant to chemicals such as, for example, acid. Inkjet printer cartridges, heads, or nozzles can be rendered more resistant to certain inks or chemicals. Other devices or materials also can be implanted to affect chemical resistance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating an electromechanical device, comprising:
   identifying a first region of interest in said electromechanical device, said first region of interest being less than the entirety of said device, wherein said first region of interest comprises a diaphragm movable relative to a fixed counterelectrode;
   performing a focused ion implantation to at least one of said first region of interest and said fixed counterelectrode; and
   affecting a property of at least one of said first region of interest and fixed counterelectrode, wherein said affecting a property comprises altering adhesion property of at least one of said first region of interest and said fixed counterelectrode.

2. The method of claim 1, wherein said first region of interest comprises a region where fluid passes through and said first property comprises hydrophobicity.

3. The method of claim 2, wherein said ion implantation is performed using $CF_4$.

4. The method of claim 1, wherein said ion implantation is performed to a depth of less than 100 nm in said region.

5. The method of claim 1, further comprising identifying a second region of interest; and
   performing a second focused ion implantation of said second region of interest.

6. The method of claim 5, wherein said second region of interest has a property to be affected different than said first property.

7. The method of claim 1, wherein said first region of interest comprises a region in contact with a chemical and said first property is resistance to said chemical.

* * * * *